United States Patent [19]

Wadsworth

[11] Patent Number: 5,274,263
[45] Date of Patent: Dec. 28, 1993

[54] FET STRUCTURE FOR USE IN NARROW BANDGAP SEMICONDUCTORS

[75] Inventor: Mark V. Wadsworth, Richardson, Tex.

[73] Assignee: Texas Instruments Incorporated, Dallas, Tex.

[21] Appl. No.: 647,373

[22] Filed: Jan. 28, 1991

[51] Int. Cl.⁵ .................. H01L 29/78; H01L 21/265
[52] U.S. Cl. .................. 257/409; 257/127; 257/170; 257/488; 437/40; 437/45
[58] Field of Search .............. 357/23.4, 53; 437/40, 437/45; 257/127, 170, 409, 488

[56] References Cited

U.S. PATENT DOCUMENTS

| | | | |
|---|---|---|---|
| 4,308,549 | 12/1981 | Yeh | 357/53 |
| 4,751,560 | 6/1988 | Rosbeck | 357/32 |
| 4,947,222 | 8/1990 | Gill et al. | 357/53 |

*Primary Examiner*—Edward Wojciechowicz
*Attorney, Agent, or Firm*—Michael K. Skrehot; James C. Kesterson; Richard L. Donaldson

[57] ABSTRACT

A FET structure for use in narrow bandgap semiconductors comprising a narrow bandgap semiconductor substrate 24, an implanted source region 12 of a conductivity type opposite that of the substrate 24, an implanted drain region 12 of the same conductivity type as source region 12 and spaced from source region 12, a first diode guard ring 14 insulatively disposed on the substrate 24 and surrounding source region 12, a second diode guard ring 14 insulatively disposed on the substrate 24 and surrounding drain region 12, a gate region 16 insulatively disposed on the substrate 24 and surrounding the source and drain regions 12 and the first and second diode guard rings 14, an outer periphery transistor guard ring 18 insulatively disposed on the substrate 24 and surrounding the gate region 16 and a field plate region 20 insulatively disposed on the substrate 24 and surrounding the outer periphery transistor guard ring 18.

Other devices, systems and methods are also disclosed.

22 Claims, 9 Drawing Sheets

FET I-$V_D$
$V_G$ = 0V TO 2V, .25V STEP

FET I-$V_G$
$V_D$ = .25V, .5V, .75V, 1V

FET I-V_D
V_G = 0V TO 2V, .25V STEP

FET I-V_G
V_D = .25V, .5V, .75V, 1V

FET I-V$_G$ (SUBTHRESHOLD)
V$_D$ = .25V, .5V, .75V, 1V

FET STRUCTURE FOR USE IN NARROW BANDGAP SEMICONDUCTORS

FIELD OF THE INVENTION

This invention generally relates to FET structures for use in narrow bandgap semiconductors.

BACKGROUND OF THE INVENTION

Without limiting the scope of the invention, its background is described in connection with forming FETs in HgCdTe, as an example.

Heretofore, in this field, it has been known that n+ on p diodes formed in HgCdTe are susceptible to surface leakage effects. There are numerous causes for surface leakage. Two of the more common causes are trapping states in the dielectric of MIS regions adjacent to the diode area, and high electric field densities which form near the corners of the n+ region. These situations lead to tunneling current contributions which increase the reverse bias leakage and reduce the breakdown voltage of HgTeCd diodes. In both of these cases, the leakage is produced in a relatively small area near the semiconductor surface immediately adjacent to the n+/p junction.

SUMMARY OF THE INVENTION

It has been found that similar problems exist in field-effect transistors (FET) fabricated in HgCdTe. Since the source and drain of a FET are simple diodes, they are subject to surface leakage effects as well. A FET affected by surface leakage exhibits a large subthreshold current. In many instances, the magnitude of the current through such a device when the gate is biased below threshold is a significant fraction of the maximum current that occurs during normal circuit operation. A second and equally significant problem associated with FETs fabricated in HgCdTe is premature reverse bias breakdown of the source and drain regions. Breakdown limits not only the maximum bias which may be applied to the source or the drain, but also, for long-channel FETs, the maximum drain-to-source bias.

In 0.25 eV infrared area detectors such as the charge-coupled device (CCD), for example, it is beneficial to fabricate the first stage of the readout electronics directly on-chip in the HgCdTe. This first stage typically consists of a reset follower amplifier utilizing FETs as the active components. FIG. 1 shows a schematic representation for a prior art reset-follower amplifier circuit. This amplifier converts signal charge to an output voltage by transferring the charge onto a capacitive sense node D1 thereby producing a change in voltage on that node. The capacitive sense node D1 is commonly known as a floating diffusion sense node and is, in fact, a simple diode. For proper operation, this sense diode D1 must be preset to a known potential during a small portion of each pixel cycle of the CCD. The known potential is applied from input terminal 8 via reset FET Q10, with the reference voltage attached to the drain of the FET Q10. Pulsing the reset FET Q10 into the "on" state provides the desired preset action. At the present time, the HgCdTe FETs comprising the on-chip amplifier are designed in a fashion similar to that used in planar silicon processing, such as the prior art HgCdTe FET shown in plan view in FIG. 2 and in cross sectional view in FIG. 3.

Fabrication of the FET amplifier directly into the HgCdTe allows for the lowest possible capacitance on which the signal charge is converted to voltage. In principle, this approach offers the highest possible signal-to-noise ratio. However, in practice the subthreshold leakage and maximum bias capability of the HgCdTe FETs limit the performance of the output amplifier. Subthreshold leakage in the FET Q10 serving as the reset switch of the reset follower of FIG. 1 causes the voltage at the floating gate or floating diffusion D1 to drift toward the substrate potential after the switch Q10 has been turned off. Since the floating gate or floating diffusion D1 is directly connected to the gate of the on-chip FET preamplifier Q12, this leakage affects the bias at the gate of the preamplifier FET Q12. This reduces the gain of the preamplifier stage which, in turn, degrades the noise performance of the entire on-chip amplifier. A similar effect is produced by premature reverse-bias breakdown of either diode in the reset FET Q10. In this case, the bias applied to the gate of the output FET Q12 through the reset FET Q10 may not be sufficiently above threshold to allow for an acceptable transconductance in the output FET Q12. Finally, any noise (1/f or shot) associated with the subthreshold leakage or diode breakdown in either the reset FET Q10 or output FET Q12 acts to degrade the signal-to-noise ratio of the on-chip amplifier, and hence, the detector. All of these potential problems hinder the effectiveness of the integrated detector approach.

Consequently, there presently exists a need for a FET structure fabricated in HgCdTe which is capable of handling a large drain-to-source bias (1.5-2.0 volts, for example) with very low subthreshold leakage (<1nA, for example). Such a FET structure would allow for near theoretical maximum signal-to-noise characteristics in the on-chip output structures an of integrated detector. The present invention is directed towards meeting those needs.

Generally, and in one form of the invention, a FET structure for use in narrow bandgap semiconductors is presented comprising a narrow bandgap semiconductor substrate, an implanted source region of a conductivity type opposite that of the substrate, an implanted drain region of the same conductivity type as the source region and spaced from the source region, a first diode guard ring insulatively disposed on the substrate and surrounding the source region, a second diode guard ring insulatively disposed on the substrate and surrounding the drain region, a gate region insulatively disposed on the substrate and surrounding the source and drain regions and the first and second diode guard rings, an outer periphery transistor guard ring insulatively disposed on the substrate and surrounding the gate region and a field plate region insulatively disposed on the substrate and surrounding the outer periphery transistor guard ring.

An advantage of the invention is that it is capable of handling a large drain-to-source bias with very low subthreshold leakage.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

Figure 1:
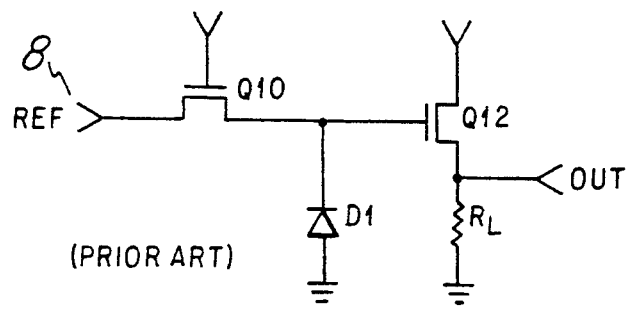
FIG. 1 is a schematic circuit diagram of a prior art reset-follower amplifier.
Figure 4:
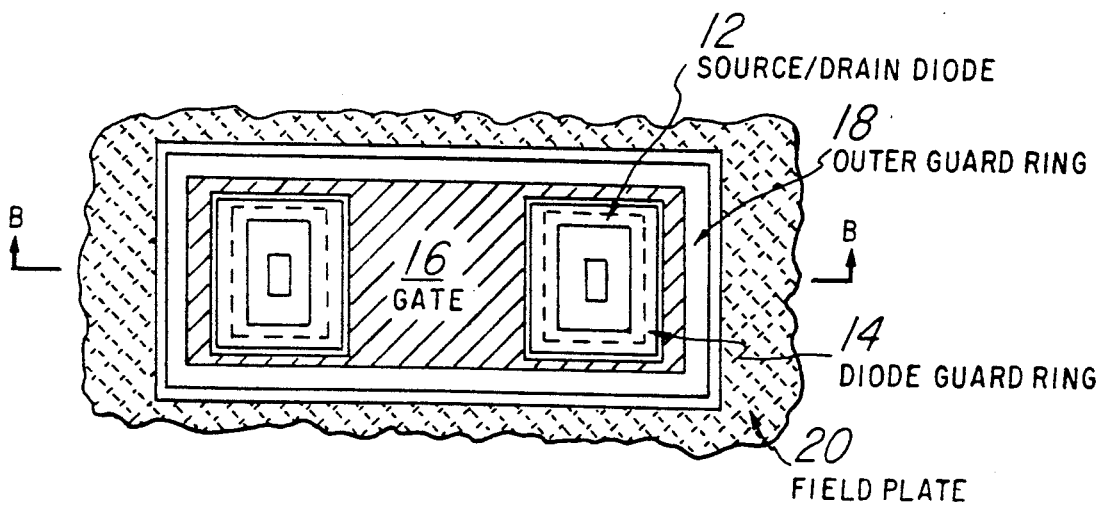
FIG. 4 is a plan view of a first preferred embodiment FET structure of the present invention.

In FIG. 4, a first preferred embodiment FET structure of the present invention is illustrated. Source/drain regions 12 contain diode implants surrounded by diode guard ring (DGR) regions 14 consisting of MIS gates. The FET gate area 16 separates the source and drain diode regions 12 as in a normal FET. However, the gate 16 of the first preferred embodiment device also completely surrounds the source/drain diode regions 12. Outside of and completely containing the gate area 16 is an outer periphery transistor guard ring (OPTGR) 18. Finally, surrounding the OPTGR 18 is the field plate 20. The field plate 20 is used to control the surface of the HgCdTe substrate (not shown) outside of the active FET area and is not actually a constituent of the FET. In a silicon device, for example, this function would be accomplished by implantation and/or by the presence of a relatively thick dielectric layer.

In operation, the FET structure of FIG. 4 exhibits several significant and important characteristics. The presence of an MIS gate (DGR 14) adjacent to source/drain diode regions 12 alters the reverse-bias breakdown characteristics of the diode 12. An n+ diode 12 in a p-type substrate 24 (see FIG. 5i) that is surrounded by an MIS gate 14 biased at flatband or accumulation will have a lower breakdown voltage than an identical planar diode without an adjacent MIS gate. To obtain a breakdown voltage in a gated-diode that is comparable to the planar ungated diode, the surface 22 adjacent to the gated diode must be held at or near strong inversion (see FIG. 5i). This can be understood by examining the electric field distribution at the semiconductor-dielectric interface in the vicinity of the metallurgical junction.

During device operation, the DGR regions 14 are biased so that the surface of the semiconductor substrate 24 beneath them is held in inversion at regions 22. These inverted regions 22 are field-induced junctions and act as extensions on the n+ implanted source and drain diodes 12. The field-induced junctions 22 lower the surface electric field strength at the metallurgical junction, thereby minimizing the reverse-bias breakdown effects. The operation of a standard FET requires the guard ring area to be accumulated in order to minimize diode crosstalk. Accumulation of the surface produces the largest possible surface electric fields near the metallurgical junction and the lowest possible diode breakdown characteristics. By utilizing the field-induced junctions 22, the proposed FET will have a larger reverse-bias breakdown than a standard FET. The improvement in breakdown voltage is significant.

Additionally, holding the semiconductor surface adjacent to the source/drain diode 12 metallurgical junction (inverted regions 22) in inversion fills any surface-related trap sites which may be present. There is a possibility that the ion implantation process (described below) will produce surface traps which are not removed by annealing at low temperatures. The trapping sites located in the p type substrate 24 or in the dielectric 30/36/42 near to the substrate 24/dielectric 30/36/42 interface induce tunneling when bias is applied to the drain diode region 12. By holding the regions 22 in inversion, these traps are kept occupied and therefore cannot contribute to the tunneling or dark current processes.

A final benefit associated with the use of field-induced junctions is a reduction in gate-to-source capacitance. During the construction of a standard FET, lateral diffusion of the n+ source/drain regions occurs during implantation and annealing. Since in the first preferred embodiment device both source/drain diode regions 12 are composed of a combination of metallurgical and field-induced junctions, and since the field-induced junction 22 completely contains the implanted (metallurgical) region 12, the source/drain diodes 12 are completely self-aligned to the gate region 16.

In the first preferred embodiment shown in FIG. 4, the gate 16 acts both as the control between the source and drain diodes 12 of the FET and also as isolation between the diode guard ring (DGR) 14 and the outer periphery transistor guard ring (OPTGR) 18. Isolation of the DGR 14 and OPTGR 18 by the gate 16 allows the FET to be constructed using only two metal layers, thereby retaining compatibility with the existing process flow used for HgCdTe charge-coupled devices. The OPTGR 18 serves to isolate the FET from its surroundings as well as to minimize the surface electric field strength due to the DGR 14 and the field plate 20 regions. Depending on the density of surface state traps in the HgCdTe substrate 24 and dielectric 30/36/42 under the OPTGR 18 electrode, the surface of substrate 24 will either be held in accumulation or at flatband. This flexibility allows for the minimum possible surface leakage at the OPTGR 18-gate 16 interface and the OPTGR 18-field plate 20 interface. Finally, the field plate region 20 serves to control the substrate 24 surface outside of the active area of the FET. In order to minimize dark current contributions, the field plate 20 must be biased so as to accumulate the substrate 24 surface beneath.

FIG. 5a–i illustrates a first preferred embodiment method for making the first preferred embodiment device of FIG. 4.

Figure 5A:
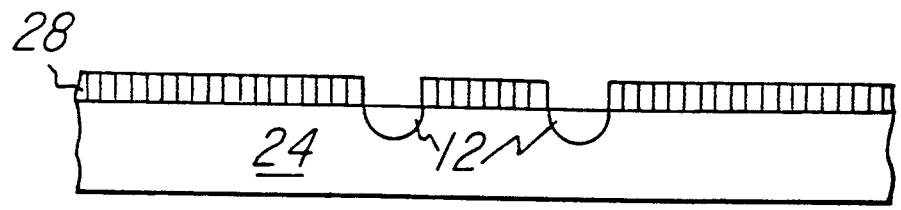
FIG. 5a–i are cross sectional views of the resulting structure after each processing step required to construct the device of FIG. 4, taken along the axis B—B'.

In FIG. 5a, a narrowband p type semiconductor substrate 24, such as HgCdTe, is provided, over the face of which is spun on a layer of photoresist 28. The photoresist layer 28 is patterned to expose source/drain diode regions 12, after which ion implantation is used to dope diode regions 12 to be n+ type using boron at a concentration of approximately $5 \times 10^{18}$ atoms/cm$^3$. The remaining portions of photoresist layer 28 are then removed.

Figure 5B:
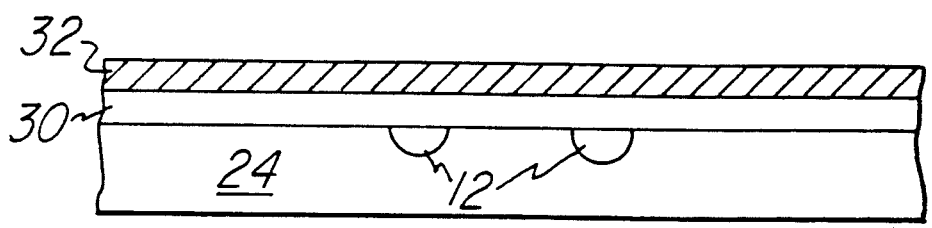

In FIG. 5b, an insulator 30, such as ZnS, is deposited across the entire wafer. Next, first metal layer 32, such as Ta, is deposited on top of insulator layer 30, by sputtering, for example.

Figure 5C:
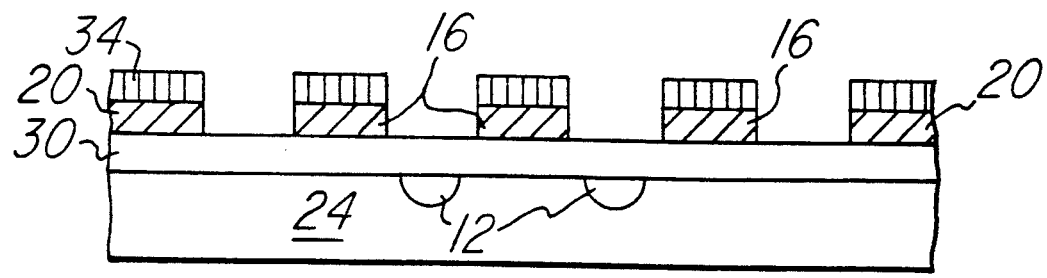

In FIG. 5c, a second layer of photoresist 34 is spun onto the wafer and patterned to define gate 16 and field plate 20 regions. Metal layer 32 is then etched down to insulator layer 30 by plasma etching, defining gate regions 16 and field plate regions 20. Afterwards, the remainder of photoresist layer 34 is removed.

Figure 5D:
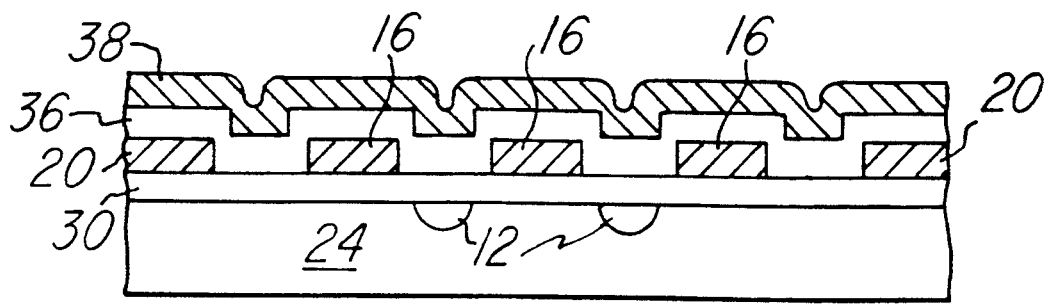

In FIG. 5d, a second insulator layer 36, such as ZnS, is deposited over the entire wafer surface. A second metal layer 38, such as Ta, is then deposited by sputtering across the entire wafer.

Figure 5E:
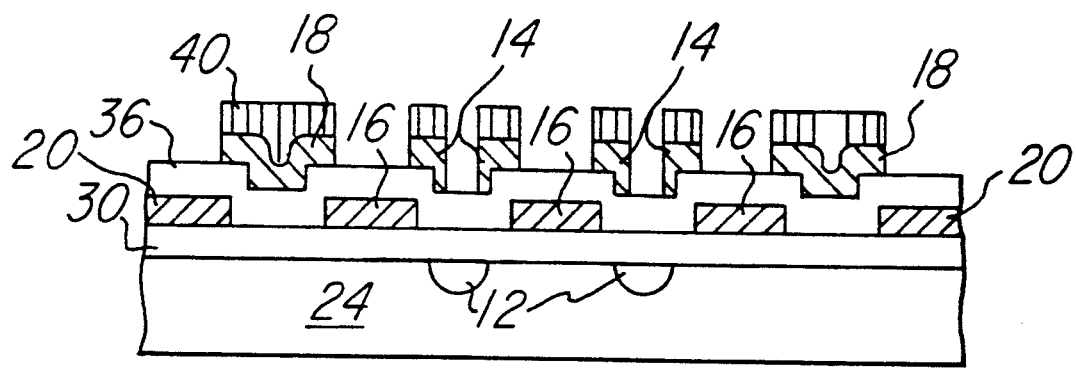

In FIG. 5e, a third photoresist layer 40 is spun onto the wafer and patterned to define diode guard ring 14 and outer periphery transistor guard ring 18 regions. Plasma etching is then used to etch through metal layer 38 down to insulator layer 36. The remaining portions of photoresist layer 40 are then removed.

Figure 5F:
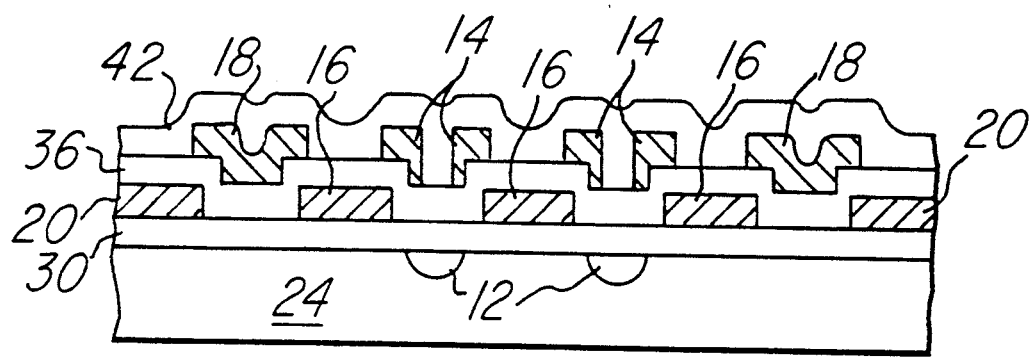

In FIG. 5f, a third insulator layer 42, such as ZnS, is deposited across the entire wafer.

Figure 5G:
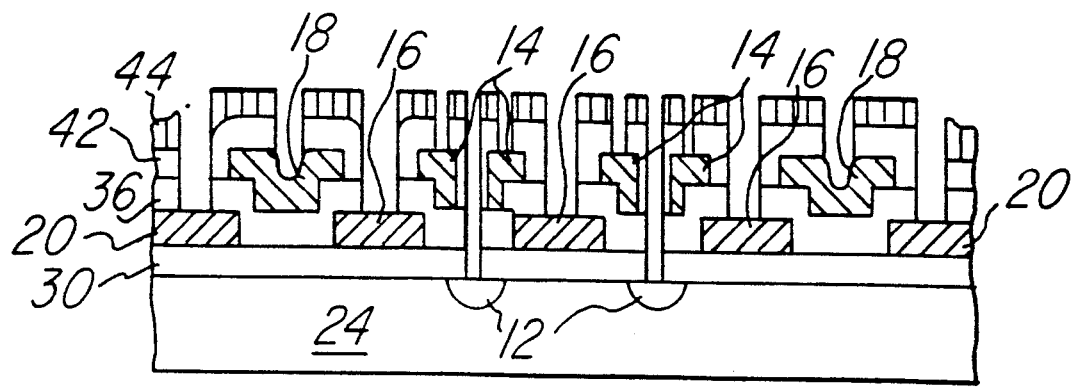

In FIG. 5g, a fourth photoresist layer 44 is spun onto the wafer and a via hole pattern is defined to enable connection to be made to patterned metal layers 32 and 38 as well as diode regions 12. The via holes are then etched by plasma etching, after which the remaining photoresist 44 is removed from the wafer.

Figure 5H:
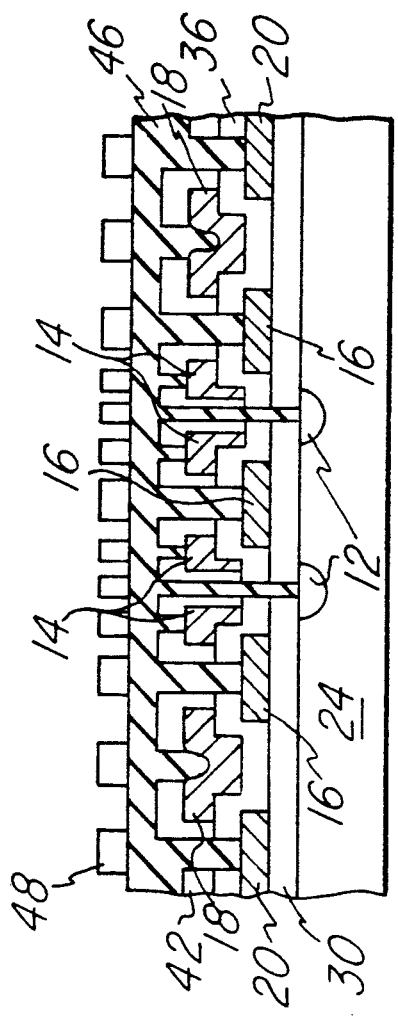

In FIG. 5h, a third metal layer 46, such as Al, is deposited across the entire wafer using sputtering, filling the via holes created during the previous processing. A fifth photoresist layer 48 is then spun onto the wafer and patterned to define the interconnect scheme for metal layer 46.

Figure 5I:
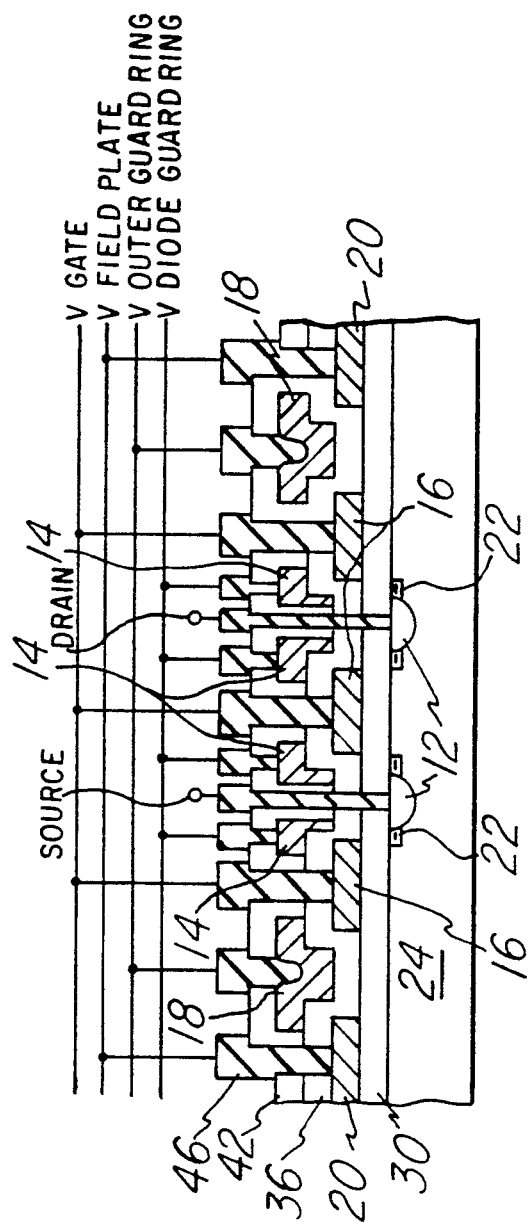

Finally, in FIG. 5i, metal layer 46 is etched through photoresist mask 48 to connect the via holes to various voltage lines as shown schematically in the figure. As a last step, the remaining portions of photoresist layer 48 are removed from the wafer.

Figure 2:
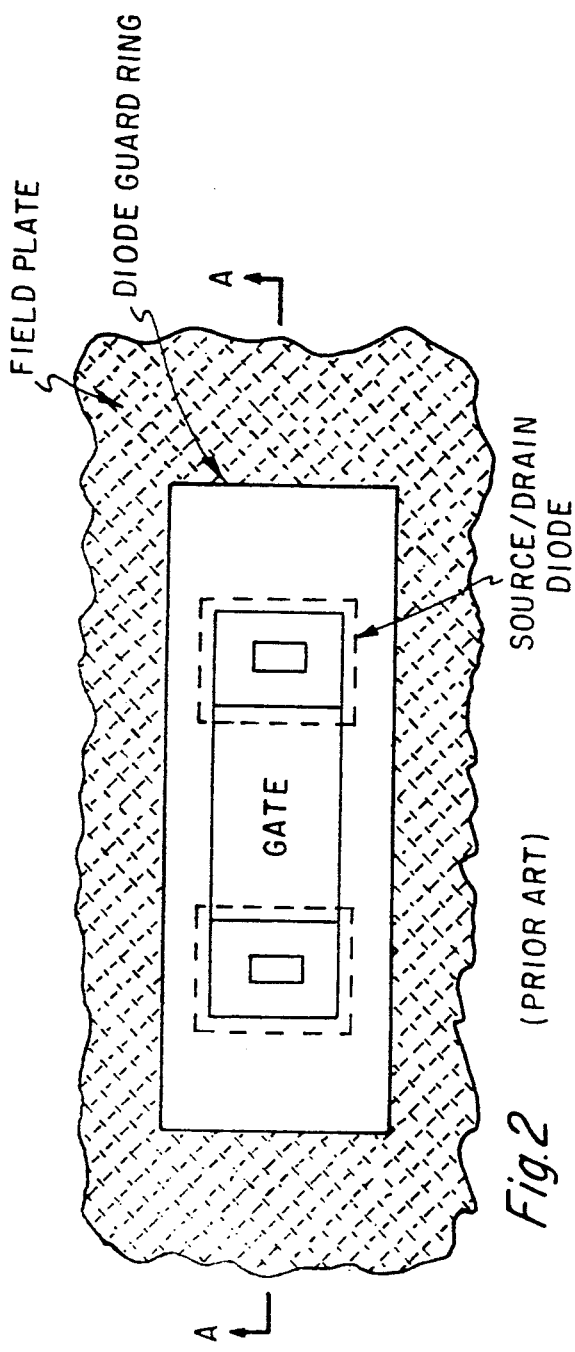
FIG. 2 is plan view of a prior art FET structure.
Figure 3:
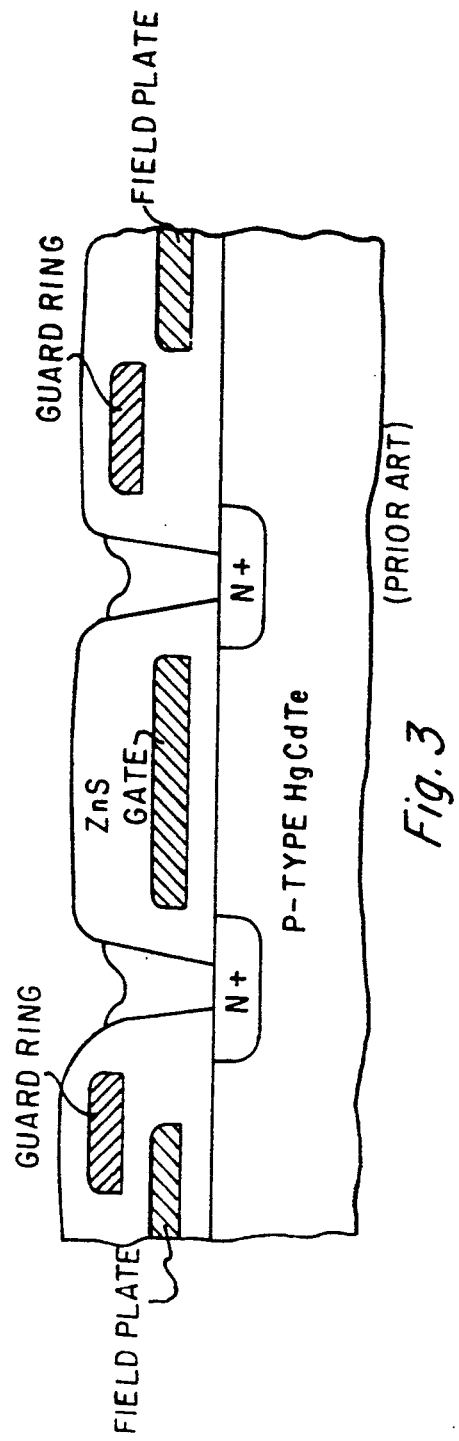
FIG. 3 is cross sectional view of the device of FIG. 2, taken along the axis A—A'.
Figure 6A:
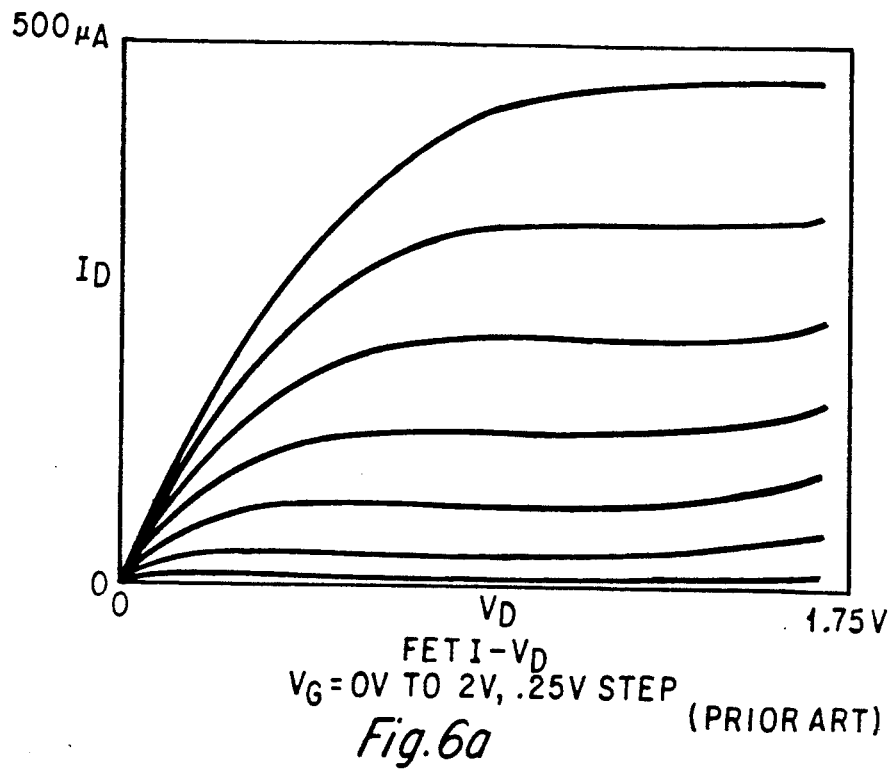
FIG. 6a–c are I–V measurements of the prior art FET of FIG. 2.
Figure 6B:
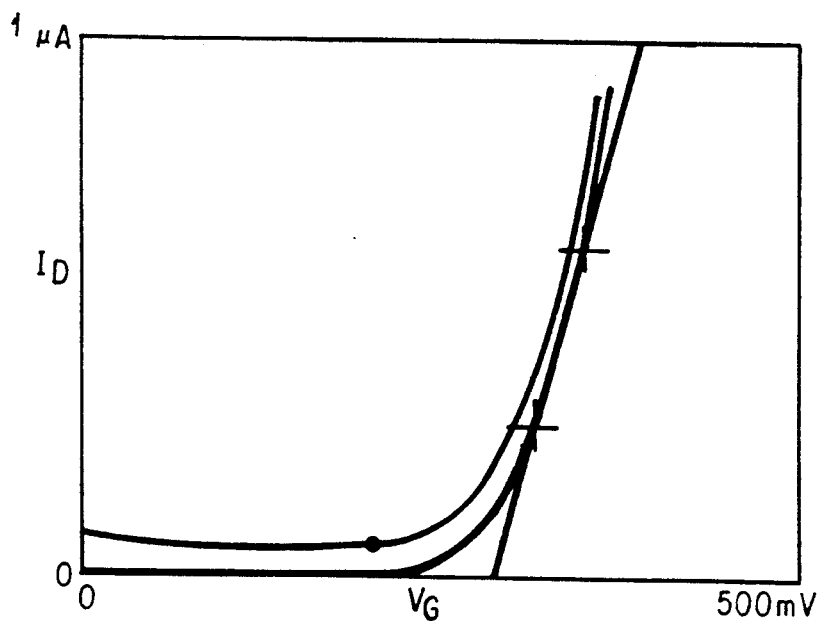
Figure 6C:
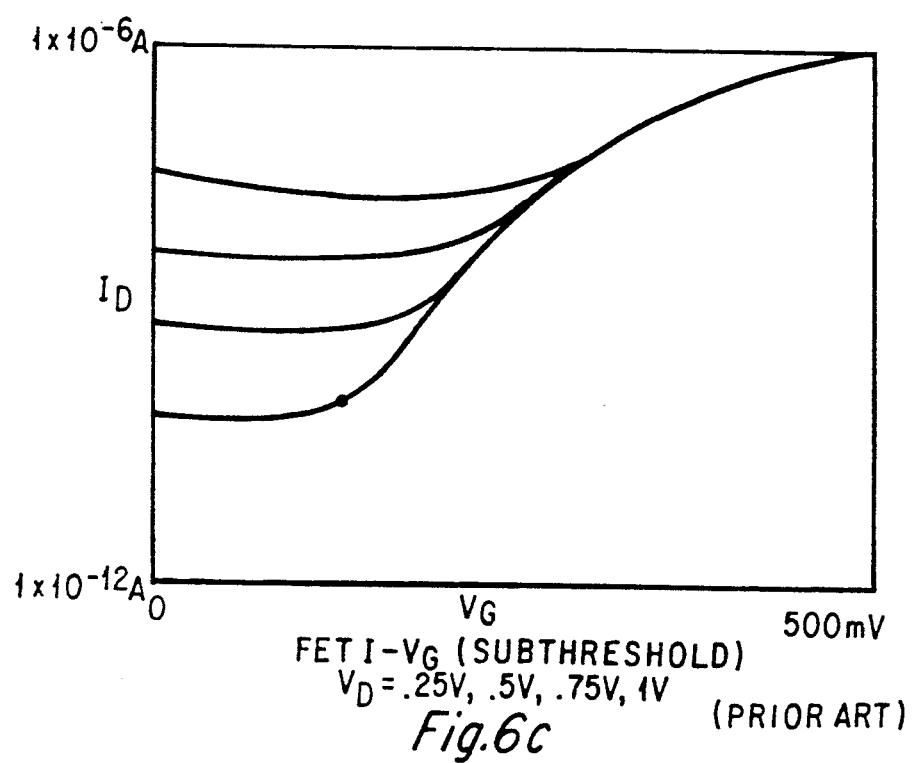

FIG. 6a-c illustrate three basic performance measurements made on the prior art FET of FIG. 2. The I-V trace of FIG. 6a shows FET current plotted versus drain voltage with the gate voltage varied parametrically from 0 V to 2 V in 0.25 V steps. It can be seen that the drain voltage begins an upward slope at about 1.5 V for all but the highest value of gate voltage, indicating the onset of avalanching. FIG. 6b shows FET current plotted versus gate voltage with the drain voltage varied parametrically from 0.25 V to 1 V in 0.25 V increments. The top trace shows that the FET is being turned on prematurely by leakage currents that flow at higher drain voltages. FIG. 6c shows FET current plotted versus gate voltage (subthreshold) with the drain voltage varied parametrically from 0.25 V to 1 V in 0.25 V increments. There is a substantial amount of leakage current, ranging from 100 pA at $V_D = 0.25$ V to 100 nA at $V_D = 1$ V.

Figure 7A:
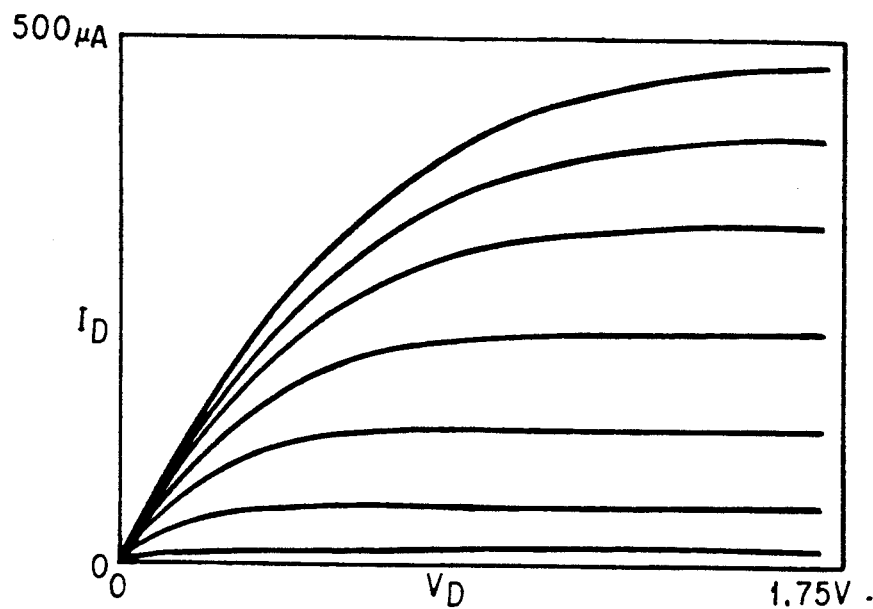
FIG. 7a–c are I–V measurements of the device of FIG. 4.
Figure 7B:
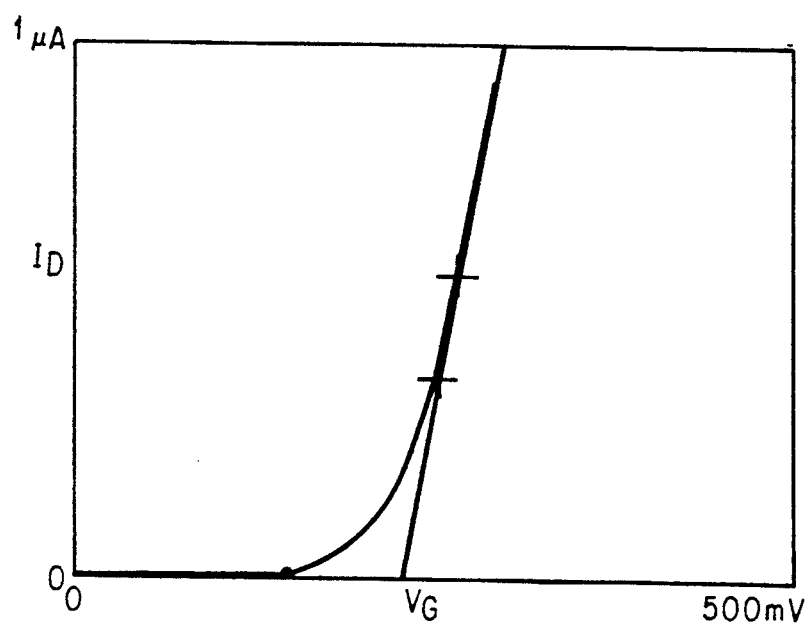
Figure 7C:
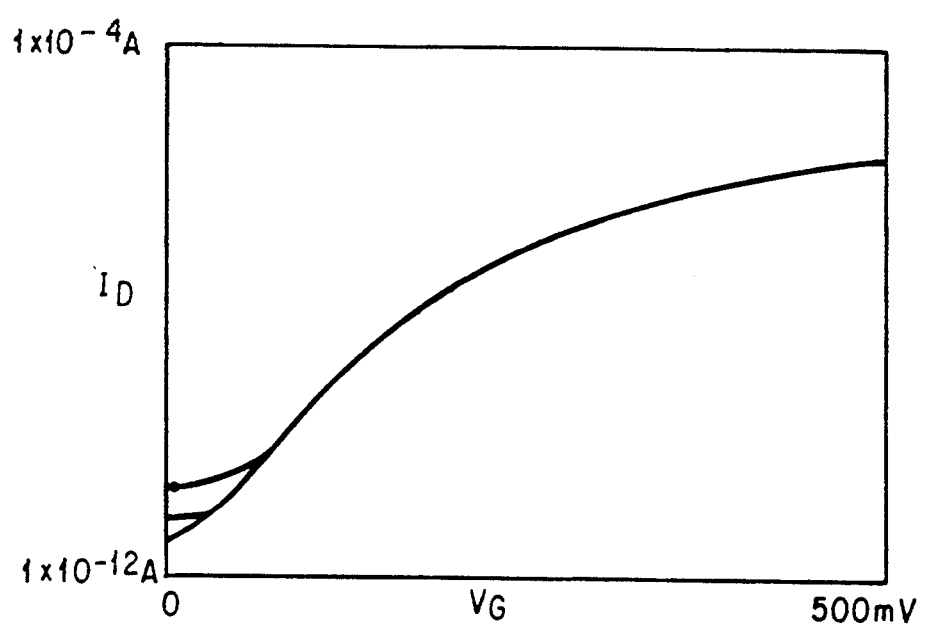

FIG. 7a-c illustrate the same three basic performance measurements as shown in FIG. 6a-c made on the first preferred embodiment FET of FIG. 4. The I-V trace of FIG. 7a shows FET current plotted versus drain voltage with the gate voltage varied parametrically from 0 V to 2 V in 0.25 V steps. It can be seen that the drain voltage remains flat throughout the entire measured range, showing no trace of avalanching. FIG. 7b shows FET current plotted versus gate voltage with the drain voltage varied parametrically from 0.25 V to 1 V in 0.25 V increments. It can be seen that the FET remains turned off at the lower gate voltages even with drain voltages applied that caused leakage currents and premature turn-on in the prior art device. FIG. 7c shows FET current plotted versus gate voltage (subthreshold) with the drain voltage varied parametrically from 0.25 V to 1 V in 0.25 V increments. (Note the different vertical scales compared to FIG. 6c). The leakage current, whose maximum is 25 pA at $V_D = 1$ V, is several orders of magnitude better than the prior art device measured in FIG. 6c.

A few preferred embodiments have been described in detail hereinabove. It is to be understood that the scope of the invention also comprehends embodiments different from those described, yet within the scope of the claims.

For example, internal and external connections can be ohmic, capacitive, direct or indirect, via intervening circuits or otherwise. Implementation is contemplated in discrete components or fully integrated circuits in HgCdTe or other narrowband electronic materials families, as well as in other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A FET structure for use in narrow bandgap semiconductors, comprising:
    a substrate of a first conductivity type having a first surface wherein said substrate is a narrow bandgap semiconductor;
    a source region of a second conductivity type at said first surface;
    a drain region of said second conductivity type at said first surface and spaced from said source region;
    a first diode guard ring insulatively disposed on said substrate wherein said first diode guard ring surrounds said source region;
    a second diode guard ring insulatively disposed on said substrate wherein said second diode guard ring surrounds said drain region; and
    a gate region insulatively disposed on said substrate.

2. The FET structure of claim 1 wherein said gate region surrounds said first and said second diode guard rings.

3. The FET structure of claim 1 further comprising an outer periphery transistor guard ring insulatively disposed on said substrate wherein said outer periphery transistor guard ring surrounds said gate region and said first and second diode guard rings.

4. The FET structure of claim 3 further comprising a field plate region insulatively disposed on said substrate wherein said field plate region surrounds said outer periphery transistor guard ring.

5. The FET structure of claim 1 wherein said narrow bandgap semiconductor is HgCdTe.

6. A charge conversion amplifier circuit, comprising:
    an input terminal for application of a reference voltage;
    a capacitive sense node for converting charge to voltage;
    a reset FET for selectively applying said reference voltage to said sense node,
        said reset FET having a drain coupled to said input terminal and a source coupled to said sense node; and
    an amplifier coupled to said sense node for amplifying said voltage, said
        amplifier comprising at least one FET, said at least one FET comprising:

a substrate of a first conductivity type having a first surface wherein said substrate is a narrow bandgap semiconductor;

a source region of a second conductivity type at said first surface;

a drain region of said second conductivity type at said first surface and spaced from said source region;

a first diode guard ring insulatively disposed on said substrate wherein said first diode guard ring surrounds said source region;

a second diode guard ring insulatively disposed on said substrate wherein said second diode guard ring surrounds said drain region; and a gate region insulatively disposed on said substrate.

7. The FET structure of claim 6 wherein said gate region surrounds said first and said second diode guard rings.

8. The charge conversion amplifier of claim 6 wherein said FET further comprises an outer periphery transistor guard ring insulatively disposed on said substrate wherein said outer periphery transistor guard ring surrounds said gate region and said first and second diode guard rings.

9. The charge conversion amplifier of claim 8 wherein said FET further comprises a field plate region insulatively disposed on said substrate wherein said field plate region surrounds said outer periphery transistor guard ring.

10. The FET structure of claim 1 wherein said narrow bandgap semiconductor is HgCdTe.

11. The charge conversion amplifier of claim 6 wherein said capacitive sense node is a floating diffusion disposed in said substrate.

12. A CCD imager having at least one charge conversion amplifier circuit formed on a substrate, each of said charge conversion amplifier circuits comprising:

an input terminal for application of a reference voltage;

a capacitive sense node for converting charge to voltage;

a reset FET for selectively applying said reference voltage to said sense node, said reset FET having a drain coupled to said input terminal and a source coupled to said sense node; and an amplifier coupled to said sense node for amplifying said voltage, said amplifier comprising at least one FET, said at least one FET comprising:

a substrate of a first conductivity type having a first surface wherein said substrate is a narrow bandgap semiconductor;

a source region of a second conductivity type at said first surface;

a drain region of said second conductivity type at said first surface and spaced from said source region;

a first diode guard ring insulatively disposed on said substrate wherein said first diode guard ring surrounds said source region;

a second diode guard ring insulatively disposed on said substrate wherein said second diode guard ring surrounds said drain region; and a gate region insulatively disposed on said substrate.

13. The FET structure of claim 12 wherein said gate region surrounds said first and said second diode guard rings.

14. The charge conversion amplifier of claim 12 wherein said FET further comprises an outer periphery transistor guard ring insulatively disposed on said substrate wherein said outer periphery transistor guard ring surrounds said gate region.

15. The charge conversion amplifier of claim 14 wherein said FET further comprises a field plate region insulatively disposed on said substrate wherein said field plate region surrounds said outer periphery transistor guard ring.

16. The FET structure of claim 12 wherein said narrow bandgap semiconductor is HgCdTe.

17. The charge conversion amplifier of claim 12 wherein said capacitive sense node is a floating diffusion disposed in said substrate.

18. A method of making a FET structure for use in narrow bandgap semiconductors, comprising the steps of:

forming a substrate of a first conductivity type having a first surface wherein said substrate is a narrow bandgap semiconductor;

implanting a source region of a second conductivity type at said first surface;

implanting a drain region of said second conductivity type at said first surface and spaced from said source region;

forming a first diode guard ring insulatively disposed on said substrate wherein said first diode guard ring surrounds said source region; forming a second diode guard ring insulatively disposed on said substrate wherein said second diode guard ring surrounds said drain region; and forming a gate region insulatively disposed on said substrate.

19. The method of claim 18, further comprising forming said gate region to surround said first and said second diode guard rings.

20. The method of claim 18, further comprising the step of forming an outer periphery transistor guard ring insulatively disposed on said substrate wherein said outer periphery transistor guard ring surrounds said gate region.

21. The method of claim 20, further comprising the steps of forming a field plate region insulatively disposed on said substrate wherein said field plate region surrounds said outer periphery transistor guard ring.

22. The method of claim 18 wherein said substrate is formed of HgCdTe.

* * * * *